US011056359B2

(12) United States Patent
Hombo et al.

(10) Patent No.: US 11,056,359 B2
(45) Date of Patent: Jul. 6, 2021

(54) CLEANING APPARATUS AND SUBSTRATE PROCESSING APPARATUS

(71) Applicant: EBARA CORPORATION, Tokyo (JP)

(72) Inventors: Teruaki Hombo, Tokyo (JP); Junji Kunisawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 244 days.

(21) Appl. No.: 16/321,179

(22) PCT Filed: Feb. 15, 2018

(86) PCT No.: PCT/JP2018/005249
§ 371 (c)(1),
(2) Date: Jan. 28, 2019

(87) PCT Pub. No.: WO2018/173562
PCT Pub. Date: Sep. 27, 2018

(65) Prior Publication Data
US 2019/0157118 A1    May 23, 2019

(30) Foreign Application Priority Data
Mar. 23, 2017 (JP) .............................. JP2017-056820

(51) Int. Cl.
*H01L 21/67* (2006.01)
*H01L 21/677* (2006.01)
(Continued)

(52) U.S. Cl.
CPC .. *H01L 21/67051* (2013.01); *H01L 21/67017* (2013.01); *H01L 21/6719* (2013.01);
(Continued)

(58) Field of Classification Search
None
See application file for complete search history.

(56) References Cited

U.S. PATENT DOCUMENTS 5,485,644 A * 1/1996 Shinbara .................. B08B 1/04
15/21.1
9,032,977 B2 * 5/2015 Hamada ............ H01L 21/67742
134/133
(Continued)

FOREIGN PATENT DOCUMENTS

JP    H10-296162 A     11/1998
JP    11-340301 A      12/1999
(Continued)

OTHER PUBLICATIONS

International Search Report Issued in Patent Application No. PCT/JP2018/005249 dated Apr. 17, 2018.
(Continued)

*Primary Examiner* — Cristi J Tate-Sims
(74) *Attorney, Agent, or Firm* — Pearne & Gordon LLP

(57) ABSTRACT

A cleaning apparatus includes a plurality of processing units including a cleaning unit which cleans a processing object, a transport chamber provided between the plurality of processing units, a transport robot provided inside the transport chamber so as to be movable vertically, an exhaust port portion which discharges gas compressed, when the transport robot descends, from a lower portion of the transport chamber, and a liquid remaining unit which causes liquid transported to the compressed gas to remain in the lower portion of the transport chamber.

12 Claims, 8 Drawing Sheets

(51) Int. Cl.
*H01L 21/673* (2006.01)
*H01L 21/687* (2006.01)

(52) U.S. Cl.
CPC .. *H01L 21/67092* (2013.01); *H01L 21/67173* (2013.01); *H01L 21/67178* (2013.01); *H01L 21/67196* (2013.01); *H01L 21/67219* (2013.01); *H01L 21/67393* (2013.01); *H01L 21/67742* (2013.01); *H01L 21/67778* (2013.01); *H01L 21/68707* (2013.01)

(56) References Cited

U.S. PATENT DOCUMENTS

| | | | |
|---|---|---|---|
| 9,387,520 B2* | 7/2016 | Ogata | H01L 21/67051 |
| 9,396,975 B2* | 7/2016 | Higashijima | H01L 21/68728 |
| 2010/0111648 A1 | 5/2010 | Tamura et al. | |

FOREIGN PATENT DOCUMENTS

| | | | |
|---|---|---|---|
| JP | 2004-349577 A | | 12/2004 |
| JP | 2008-147303 A | | 6/2008 |
| JP | 2008147303 A | * | 6/2008 |
| JP | 2008-211196 A | | 9/2008 |
| JP | 2013-089689 A | | 5/2013 |
| JP | 2014-212288 A | | 11/2014 |
| JP | 2015-207602 A | | 11/2015 |

OTHER PUBLICATIONS

Written Opinion Issued in Patent Application No. PCT/JP2018/005249 dated Apr. 17, 2018.

* cited by examiner

CLEANING APPARATUS AND SUBSTRATE PROCESSING APPARATUS

TECHNICAL FIELD

The present invention relates to a cleaning apparatus and a substrate processing apparatus.

The present application is a 371 of International Application No. PCT/JP2018/005249 filed Feb. 15, 2018 and claims the priority based on Japanese Patent Application No. 2017-056820 filed in Japan on Mar. 23, 2017, the contents of which are hereby incorporated herein.

BACKGROUND ART

In the related art, a substrate processing apparatus described in Patent Document 1 below is known. The substrate processing apparatus is a chemical mechanical polishing (CMP) apparatus which polishes a surface of a substrate such as a silicon wafer into a flat surface and includes a polisher which polishes the substrate and a cleaner (cleaning apparatus) which cleans the substrate. The cleaning apparatus includes a plurality of cleaning units and drying units for removing residues of slurry used for CMP and minute particles such as metal polishing waste, and delivery of substrates between the units is performed by a transport robot which can move vertically.

PRIOR ART DOCUMENTS

Patent Documents

[Patent Document 1]
Japanese Unexamined Patent Application, First Publication No. 2015-207602 A

DISCLOSURE OF INVENTION

Problems to be Solved by the Invention

Since a transport chamber in which the transport robot is provided has a limited footprint (installation area), it is difficult to secure a large gap between the transport robot and the transport chamber. When the transport robot descends in such a limited space, the pressure in the lower portion of the transport chamber rises while the pressure in the upper portion of the transport chamber decreases, which may result in the occurrence of an airflow from the lower portion to the upper portion of the transport chamber through the gap between the transport robot and the transport chamber. When particles accumulated on the bottom surface of the transport chamber are raised by this airflow, particles may adhere to the substrate in some cases.

The present invention has been made in view of the above circumstances, and provides a cleaning apparatus and a substrate processing apparatus capable of suppressing particles from being raised as a transport robot descends.

Means for Solving the Problems

A first aspect of the present invention is a cleaning apparatus, including a plurality of processing units including a cleaning unit which cleans a processing object, a transport chamber provided between the plurality of processing units, a transport robot provided inside the transport chamber so as to be movable vertically, an exhaust port portion which discharges gas compressed, when the transport robot descends, from a lower portion of the transport chamber, and a liquid remaining unit which causes liquid transported to the compressed gas to remain in the lower portion of the transport chamber.

A second aspect of the present invention is the cleaning apparatus according to the first aspect, in which the exhaust port portion may open on a bottom surface of the transport chamber, and the liquid remaining unit may include a jetty of a projecting shape provided upright between the bottom surface of the transport chamber and the exhaust port portion and a roof of a recessed shape facing the jetty with a gap therebetween.

A third aspect of the present invention is the cleaning apparatus according to the second aspect, in which the roof may be inclined downward from the exhaust port portion toward the bottom surface of the transport chamber.

A fourth aspect of the present invention is the cleaning apparatus of the second or third aspect, in which the roof may have a gap adjuster which adjusts a size of the gap from the jetty.

A fifth aspect of the present invention is the cleaning apparatus according to any one of the first to fourth aspects, the cleaning apparatus may further include a gas supplier which supplies gas from an upper portion to the lower portion of the transport chamber.

A sixth aspect of the present invention is the cleaning apparatus according to the fifth aspect, in which the plurality of processing units includes: a first processing unit communicating with the transport chamber via a first communicating hole, and a second processing unit communicating with the transport chamber via a second communicating hole below the first processing unit, and the exhaust port portion has a size that substantially equalizes a flow rate of the gas, supplied from the gas supplier, exhausted from the first communicating hole and a flow rate of the gas exhausted from the second communicating hole.

A seventh aspect of the present invention is the cleaning apparatus according to any one of the first to sixth aspects, the cleaning apparatus may further include a transport chamber interior cleaner which cleans an inside of the transport chamber.

An eighth aspect of the present invention is the cleaning apparatus according to the seventh aspect, in which the transport chamber interior cleaner may have a nozzle capable of jetting out liquid toward a side wall surface of the transport chamber.

A ninth aspect of the present invention is the cleaning apparatus according to the seventh or eighth aspect, in which the transport chamber interior cleaner may further include a nozzle-moving device which moves the nozzle between a transport chamber interior cleaning position where the nozzle is directed toward a side wall surface of the first transport chamber and a transport robot cleaning position where the nozzle is directed toward the transport robot.

A tenth aspect of the present invention is a substrate processing apparatus including: a polisher which polishes a substrate; and a cleaner which cleans the substrate, in which the substrate processing apparatus includes the cleaning apparatus according to any one of the first to ninth aspects as the cleaner.

Effects of the Invention

According to the aspects of the present invention described above, it is possible to suppress particles from being raised as a transport robot descends.

EMBODIMENTS FOR CARRYING OUT THE INVENTION

Hereinafter, a cleaning apparatus and a substrate transport apparatus according to an embodiment of the present invention will be described with reference to the drawings.

Figure 1:
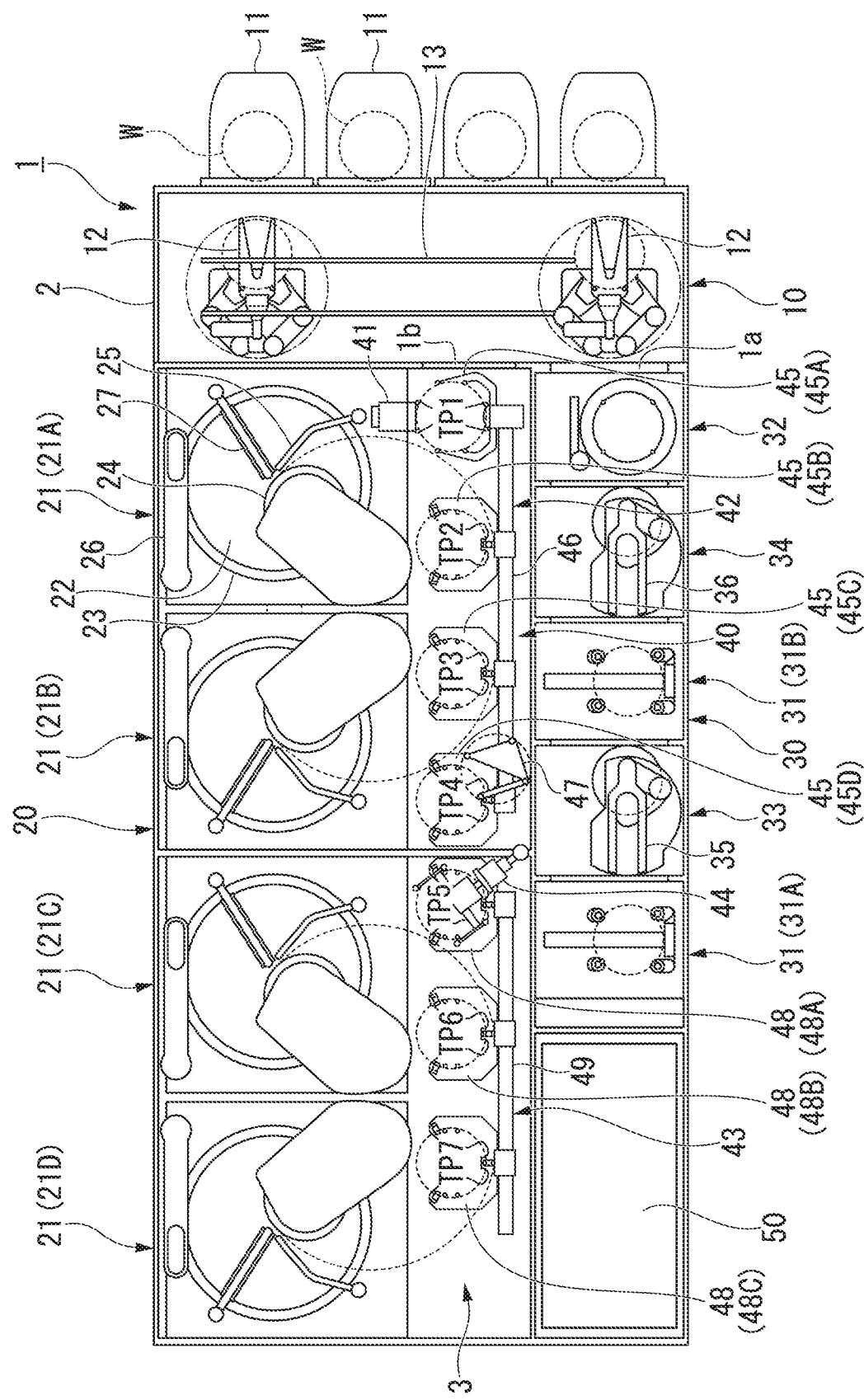
FIG. 1 is a plan view representing the overall configuration of a substrate processing apparatus 1 according to an embodiment.

FIG. 1 is a plan view representing the overall configuration of a substrate processing apparatus 1 according to an embodiment.

The substrate processing apparatus 1 illustrated in FIG. 1 is a chemical mechanical polishing (CMP) apparatus which polishes a surface of a substrate W such as a silicon wafer into a flat surface. The substrate processing apparatus 1 includes a rectangular box-shaped housing 2. The housing 2 is formed into a substantially rectangular shape in plan view.

The housing 2 includes a substrate transport path 3 extending longitudinally at the center thereof. A loader/unloader 10 is disposed at one end of the substrate transport path 3 in the longitudinal direction. A polisher 20 is disposed on one side in the width direction (direction orthogonal to the longitudinal direction in plan view) of the substrate transport path 3, and a cleaner 30 (cleaning apparatus) is disposed on the other side. In the substrate transport path 3, a substrate transport unit 40 which transports the substrate W is provided. The substrate processing apparatus 1 further includes a controller 50 (control panel) that controls the loader/unloader 10, the polisher 20, the cleaner 30, and the substrate transport unit 40.

The loader/unloader 10 includes front loaders 11 that accommodate the substrates W. A plurality of front loaders 11 is provided on a side surface of the housing 2 at one end in the longitudinal direction. The plurality of front loaders 11 is arrayed in the width direction of the housing 2. The front loaders 11 are mounted with an open cassette, a standard manufacturing interface (SMIF) pod, or a front opening unified pod (FOUP), for example. The SMIF and FOUP are airtight containers that accommodate cassettes for the substrates W therein and are covered with partition walls. The SMIF and FOUP can maintain an environment independent of the external space.

The loader/unloader 10 further includes two transport robots 12 which take and return a substrate W from/to the front loaders 11 and a traveling mechanism 13 which causes each of the transport robots 12 to travel along the arrangement of the front loaders 11. Each of the transport robots 12 includes two hands on the upper and lower sides, which are used selectively before and after processing of the substrate W. For example, the upper hand is used to return the substrate W to a front loader 11, and the lower hand is used to take out an unprocessed substrate W from a front loader 11.

The polisher 20 includes a plurality of polishing units 21 (21A, 21B, 21C, and 21D) which polishes (planarizes) the substrates W. The plurality of polishing units 21 is arrayed in the longitudinal direction of the substrate transport path 3. Each of the polishing units 21 includes a polishing table 23 which rotates a polishing pad 22 having a polishing surface, a top ring 24 which holds a substrate W and polishes the substrate W while pressing the substrate W against the polishing pad 22 on the polishing table 23, a polishing liquid-supplying nozzle 25 which supplies polishing liquid or dressing liquid (for example, pure water) to the polishing pad 22, a dresser 26 which performs a dressing on a polishing surface of the polishing pad 22, and an atomizer 27 which emits a jet of a mixed fluid of a liquid (for example, pure water) and a gas (for example, nitrogen gas) or a liquid (for example, pure water) onto the polishing surface in a mist state.

In each of the polishing units 21, while the polishing liquid is supplied from the polishing liquid-supplying nozzle 25 onto the polishing pad 22, the substrate W is pressed against the polishing pad 22 by the top ring 24, and the top ring 24 and the polishing table 23 are caused to move relative to each other, thereby the substrate W is polished to make the surface of the substrate W flat. In the dresser 26, hard particles such as diamond particles or ceramic particles are fixed to a rotator at the tip to be in contact with the polishing pad 22. Rotation and oscillation of the rotator results in uniform dressing of the entire polishing surface of the polishing pad 22, thereby forming a flat polishing surface. The atomizer 27 washes away polishing waste, abrasive grains, or the like remaining on the polishing surface of the polishing pad 22 with a high-pressure fluid and thereby cleans the polishing surface and performs a dressing operation of the polishing surface, that is, renovation of the polishing surface by the dresser 26 which is a mechanical contact.

The cleaner 30 includes a plurality of cleaning units 31 (31A and 31B) which cleans the substrates W and a drying unit 32 which dries the cleaned substrates W. The plurality of cleaning units 31 and the drying unit 32 (plurality of processing units) are arrayed in the longitudinal direction of the substrate transport path 3. Between the cleaning unit 31A and the cleaning unit 31B, a first transport chamber 33 is provided. In the first transport chamber 33, a transport robot 35 which transports a substrate W among the substrate transport unit 40, the cleaning unit 31A, and the cleaning unit 31B is provided. A second transport chamber 34 is further provided between the cleaning unit 31B and the drying unit 32. In the second transport chamber 34, a transport robot 36 which transports a substrate W between the cleaning unit 31B and the drying unit 32 is provided.

The cleaning unit 31A includes, for example, a cleaning module of a roll sponge type and primarily cleans the substrate W. The cleaning unit 31B also includes a cleaning module of a roll sponge type and secondarily cleans the substrate W. Note that the cleaning unit 31A and the cleaning unit 31B may be the same cleaning module or different cleaning modules and may be, for example, a cleaning module of a pencil sponge type or a cleaning module of a two-fluids jet type. The drying unit 32 includes, for example, a drying module which performs Rotagoni drying (isopropyl alcohol (IPA) drying). After drying, a shutter 1a provided to a partition wall between the drying unit 32 and the loader/unloader 10 is opened, and the substrate W is taken out from the drying unit 32 by a transport robot 12.

The substrate transport unit 40 includes a lifter 41, a first linear transporter 42, a second linear transporter 43, and a swing transporter 44. In the substrate transport path 3, a first transport position TP1, a second transport position TP2, a third transport position TP3, a fourth transport position TP4, a fifth transport position TP5, a sixth transport position TP6, and a seventh transport position TP7 are set in the order mentioned from the end thereof where the loader/unloader 10 is provided.

The lifter 41 is a mechanism that transports a substrate W in the vertical direction at the first transport position TP1. At the first transport position TP1, the lifter 41 receives a substrate W from a transport robot 12 of the loader/unloader 10. The lifter 41 then delivers the substrate W received from the transport robot 12 to the first linear transporter 42. A shutter 1b is provided to a partition wall between the first transport position TP1 and the loader/unloader 10. When the substrate W is transported, the shutter 1b is opened and the substrate W is delivered to the lifter 41 from the transport robot 12.

The first linear transporter 42 is a mechanism for transporting the substrate W between the first transport position TP1, the second transport position TP2, the third transport position TP3, and the fourth transport position TP4. The first linear transporter 42 includes a plurality of transport hands 45 (45A, 45B, 45C, and 45D) and a linear guide mechanism 46 which horizontally moves each of the transport hands 45 at a plurality of heights. The transport hand 45A moves between the first transport position TP1 and the fourth transport position TP4 by the linear guide mechanism 46. The transport hand 45A is a pass hand that receives the substrate W from the lifter 41 and delivers the substrate W to the second linear transporter 43. The transport hand 45A is not provided with any lifting/descending driver.

The transport hand 45B moves between the first transport position TP1 and the second transport position TP2 by the linear guide mechanism 46. The transport hand 45B receives the substrate W from the lifter 41 at the first transport position TP1 and delivers the substrate W to the polishing unit 21A at the second transport position TP2. The transport hand 45B is provided with a lifting/descending driver and ascends when delivering the substrate W to the top ring 24 of the polishing unit 21A and then descends after delivering the substrate W to the top ring 24. Note that a similar lifting/descending driver is provided also in the transport hand 45C and the transport hand 45D.

The transport hand 45C moves between the first transport position TP1 and the third transport position TP3 by the linear guide mechanism 46. The transport hand 45C receives the substrate W from the lifter 41 at the first transport position TP1 and delivers the substrate W to the polishing unit 21B at the third transport position TP3. The transport hand 45C also functions as an access hand that receives the substrate W from the top ring 24 of the polishing unit 21A at the second transport position TP2 and delivers the substrate W to the polishing unit 21B at the third transport position TP3.

The transport hand 45D moves between the second transport position TP2 and the fourth transport position TP4 by the linear guide mechanism 46. The transport hand 45D also functions as an access hand that receives the substrate W from a top ring 24 of the polishing unit 21A or the polishing unit 21B at the second transport position TP2 or the third transport position TP3 and delivers the substrate W to the swing transporter 44 at the fourth transport position TP4.

The swing transporter 44 has a hand movable between the fourth transport position TP4 and the fifth transport position TP5 and delivers the substrate W from the first linear transporter 42 to the second linear transporter 43. Moreover, the swing transporter 44 delivers the substrate W polished in the polisher 20 to the cleaner 30. A temporary placement stand 47 for a substrate W is provided within the movement range of a hand of the swing transporter 44. The swing transporter 44 places the substrate W received at the fourth transport position TP4 or the fifth transport position TP5 on the temporary placement stand 47 upside down. The substrate W placed on the temporary placement stand 47 is transported to the first transport chamber 33 by the transport robot 35 of the cleaner 30.

The second linear transporter 43 is a mechanism that transports the substrate W between the fifth transport position TP5, the sixth transport position TP6, and the seventh transport position TP7. The second linear transporter 43 includes a plurality of transport hands 48 (48A, 48B, and 48C) and a linear guide mechanism 49 that horizontally moves each of the transport hands 45 at a plurality of heights. The transport hand 48A moves between the fifth transport position TP5 and the sixth transport position TP6 by the linear guide mechanism 49. The transport hand 45A functions as an access hand that receives the substrate W from the swing transporter 44 and delivers the substrate W to the polishing unit 21C.

The transport hand 48B moves between the sixth transport position TP6 and the seventh transport position TP7. The transport hand 48B functions as an access hand that receives the substrate W from the polishing unit 21C and delivers the substrate W to the polishing unit 21D. The transport hand 48C moves between the seventh transport position TP7 and the fifth transport position TP5. The transport hand 48C also functions as an access hand that receives the substrate W from a top ring 24 of the polishing unit 21C or the polishing unit 21D at the sixth transport position TP6 or the seventh transport position TP7 and delivers the substrate W to the swing transporter 44 at the fifth transport position TP5. Note that, although explanation is omitted, the operation at the time when the transport hands 48 transport the substrate W is similar to the above-described operation of the first linear transporter 42.

Figure 2:
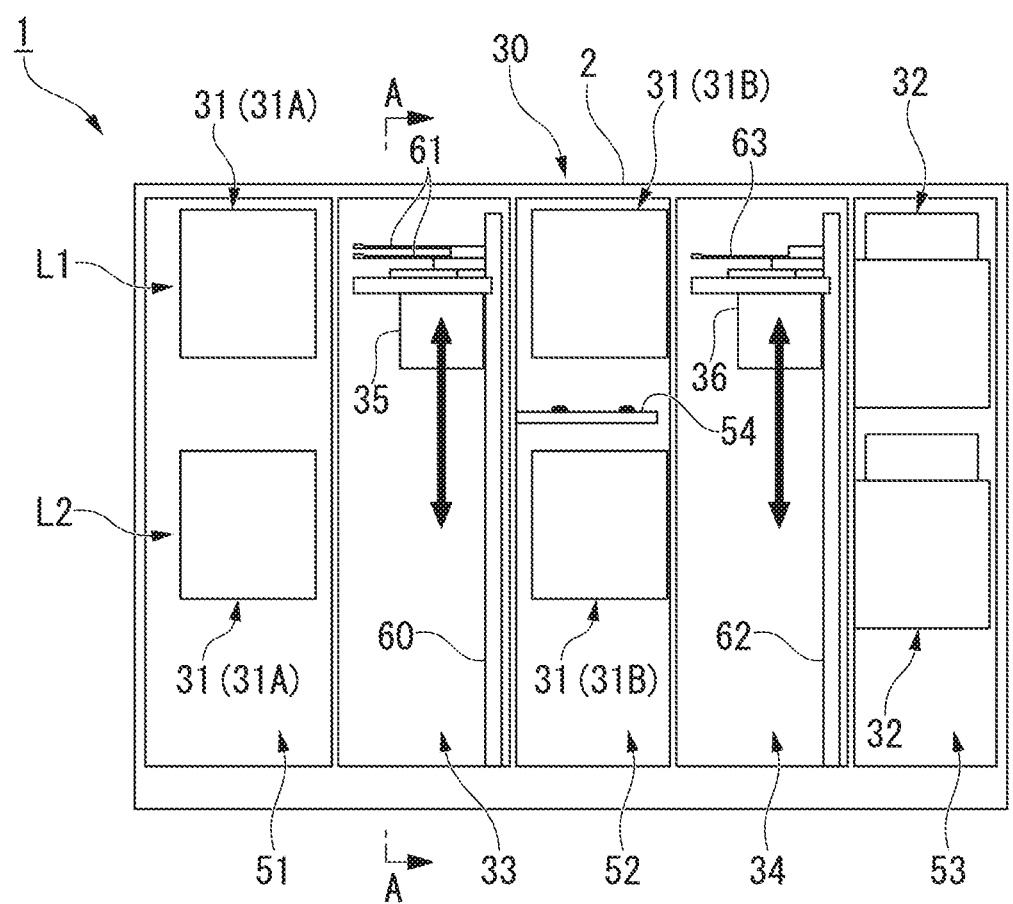
FIG. 2 is a side view representing a cleaner 30 according to the embodiment.

FIG. 2 is a side view representing the cleaner 30 according to the embodiment.

As illustrated in FIG. 2, the cleaner 30 includes a first unit-accommodating chamber 51, a second unit-accommodating chamber 52, and a third unit-accommodating chamber 53. The first unit-accommodating chamber 51, the second unit-accommodating chamber 52, and the third unit-accommodating chamber 53 are formed into a multistage shelf shape by a frame of the housing 2. Furthermore, the first unit-accommodating chamber 51, the second unit-accommodating chamber 52, and the third unit-accommodating chamber 53 accommodate units such that each of the accommodated units can be drawn out in the width direction of the housing 2 (the direction perpendicular to the sheet surface in FIG. 2).

In the first unit-accommodating chamber 51, cleaning units 31A are accommodated in two stages of upper and lower stages. That is, in the first unit-accommodating chamber 51, two cleaning units 31A are accommodated in such a manner so as to be stacked in the vertical direction. Likewise, in the second unit-accommodating chamber 52, cleaning units 31B are accommodated in two stages of upper and lower stages. Further likewise, in the third unit-accommodating chamber 53, drying units 32 are accommodated in two stages of upper and lower stages. Note that a temporary placement stand 54 for a substrate W is provided between the upper and lower cleaning units 31B of the second unit-accommodating chamber 52.

In the cleaner 30, the cleaning unit 31A, the cleaning unit 31B, and the drying unit 32 of a first lane L1 accommodated in the upper stage are capable of performing a series of processings from cleaning to drying of a substrate W, and the cleaning unit 31A, the cleaning unit 31B, and the drying unit 32 of a second lane L2 accommodated in the lower stage are capable of performing a series of processings from cleaning to drying of a substrate W. That is, in the cleaner 30, a substrate W can be subjected to cleaning processing in parallel respectively in the first lane L1 and the second lane L2.

The first transport chamber 33 is provided between the first unit-accommodating chamber 51 and the second unit-accommodating chamber 52. Inside the first transport chamber 33, the transport robot 35 is provided so as to be movable vertically along a support shaft 60 extending in the vertical direction. The transport robot 35 has two-stage hands 61 of upper and lower stages. The transport robot 35 uses the lower hand 61 when transporting a substrate W before cleaning and uses the upper hand 61 when transporting the cleaned substrate W, for example. The transport robot 35 enables delivery of the substrate W between the cleaning units 31A and 31B of the first lane L1 and delivery of the substrate W between the cleaning units 31A and 31B of the second lane L2.

The second transport chamber 34 is provided between the second unit-accommodating chamber 52 and the third unit-accommodating chamber 53. Inside the second transport chamber 34, the transport robot 36 is provided so as to be movable vertically along a support shaft 62 extending in the vertical direction. Since the transport robot 35 transports only cleaned substrates W, the transport robot 35 has only one hand 63. The transport robot 36 enables delivery of a substrate W between the cleaning unit 31B and the drying unit 32 of the first lane L1 and delivery of a substrate W between the cleaning unit 31A and the drying unit 32 of the second lane L2.

Next, the configuration of the first transport chamber 33 will be described in detail with reference to FIGS. 3, 4A, and 4B. Note that the second transport chamber 34 also has a similar configuration, and description thereof overlaps with that of the configuration of the first transport chamber 33 and thus will be omitted.

Figure 3:
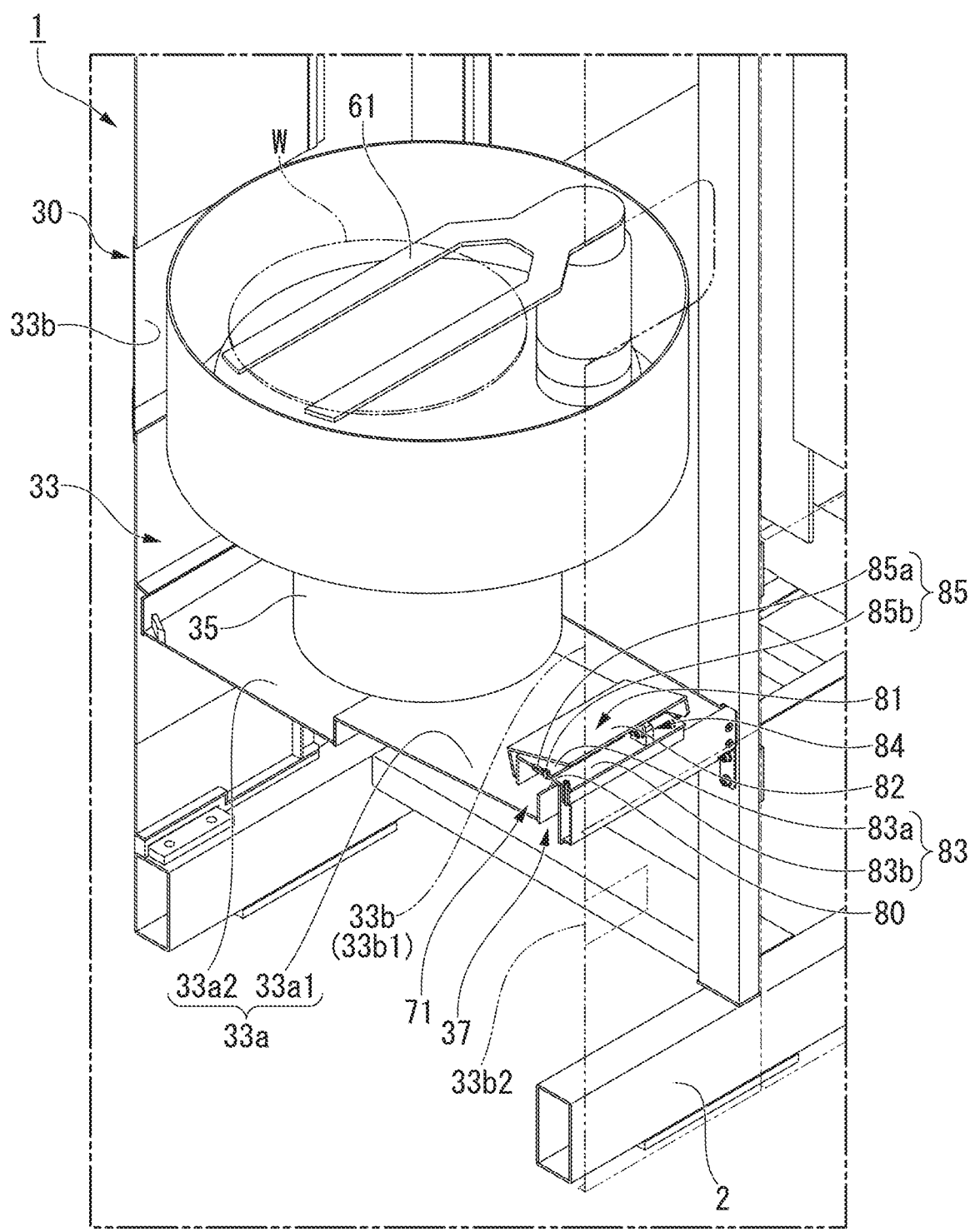
FIG. 3 is a perspective vertical cross-sectional view representing a lower portion of a first transport chamber 33 according to the embodiment.

FIG. 3 is a perspective vertical cross-sectional view representing a lower portion of the first transport chamber 33 according to the embodiment. Note that FIG. 3 corresponds to the A-A cross section illustrated in FIG. 2. FIGS. 4A and 4B are schematic vertical cross-sectional view representing the overall structure of the first transport chamber 33 according to the embodiment.

As illustrated in FIG. 3, an exhaust port (exhaust port portion) 37 opens on a bottom surface 33a of the first transport chamber 33. The bottom surface 33a is formed into a rectangular shape in plan view, and a front-side bottom surface 33a1 in the unit-drawing direction is higher than a far-side bottom surface 33a2. The exhaust port 37 is provided on the front-side bottom surface 33a1. Furthermore, a drain port 38 (not illustrated in FIG. 3, see FIGS. 4A and 4B) is provided on the far-side bottom surface 33a2.

Side wall surfaces 33b of the first transport chamber 33 rise from the periphery of the bottom surface 33a and surround the transport robot 35 from the four sides. As illustrated in FIG. 3, the front-side wall surface 33b provided with the exhaust port 37 is formed by a door 33b1 attached to the housing 2 so as to be openable and closable.

A handle 33b2 is provided to the door 33b1 such that the interior of the first transport chamber 33 is accessible by pulling the handle 33b2 and opening the door 33b1. Note that an inner cover (not illustrated) may be provided inside the door 33b1 and the side wall surface 33b may be formed by the inner cover.

Figure 4A:
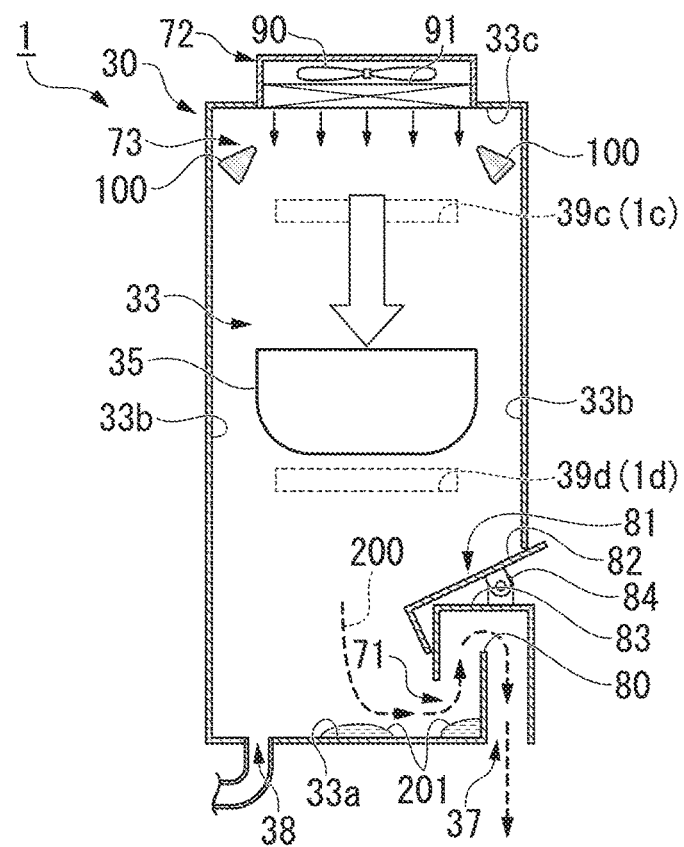
FIG. 4A is a schematic vertical cross-sectional view representing the overall structure of the first transport chamber 33 according to the embodiment.
Figure 4B:
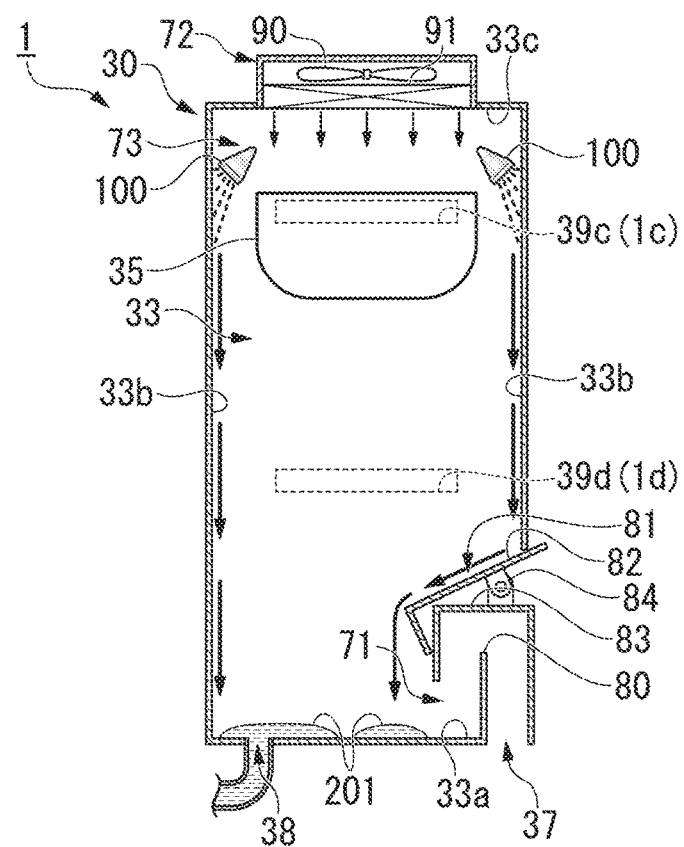
FIG. 4B is a schematic vertical cross-sectional view representing the overall structure of the first transport chamber 33 according to the embodiment.

As illustrated in FIG. 4A, the first transport chamber 33 includes a liquid remaining unit 71, a gas supplier 72, and a transport chamber interior cleaner 73. The liquid remaining unit 71 prevents liquid 201 accumulated on the bottom surface 33a of the first transport chamber 33 from being transported by gas 200 compressed when the transport robot 35 descends and from leaking out from the exhaust port 37. The liquid remaining unit 71 has a jetty 80 of a projecting shape and a roof 81 of a recessed shape, which form a labyrinth structure.

The jetty 80 is provided upright between the bottom surface 33a of the first transport chamber 33 and the exhaust port 37. The jetty 80 is a long plate-shaped member and is joined or bolted to the bottom surface 33a of the first transport chamber 33 as illustrated in FIG. 3. The roof 81 faces the upper end of the jetty 80 with a gap therebetween in the vertical direction and faces to both side surfaces of the jetty 80 with gaps therebetween in the left-right direction (unit-drawing direction). The roof 81 includes an inclined frame 82 inclined downward from above the exhaust port 37 toward the bottom surface 33a of the first transport chamber 33 and a recessed frame 83 facing the jetty 80 with a gap therebetween as described above.

The inclined frame 82 is an L-shaped frame body covering over the recessed frame 83. A coupler 84 to which the inclined frame 82 is coupled is provided on the recessed frame 83, and the inclined frame 82 is supported by the recessed frame 83 via the coupler 84. The recessed frame 83 has an L-shaped first frame body 83a and a flat plate-shaped second frame body 83b. The second frame body 83b has the coupler 84 and is fixed to the housing 2 via a bolt.

The recessed frame 83 has a gap adjuster 85 which adjusts the size of the gap from the jetty 80. The gap adjuster 85 is formed by a long hole 85a formed in the first frame body 83a and a bolt 85b fastening and fixing the first frame body 83a to the second frame body 83b via the long hole 85a. The long hole 85a extends in the left-right direction, and the first frame body 83a can be fixed to the second frame body 83b at a desired position in the left-right direction. In this manner, the recessed frame 83 allows the size of the gap with the jetty 80 in the left-right direction to be adjusted.

As illustrated in FIG. 4A, the gas supplier 72 supplies gas from the upper portion to the lower portion of the first transport chamber 33. The gas supplier 72 includes a fan 90 and a filter 91. The filter 91 is provided on a top surface 33c of the first transport chamber 33. The filter 91 is, for example, a HEPA filter, an ULPA filter, or the like. The fan 90 supplies gas via the filter 91 and forms a downflow in the first transport chamber 33. Note that the fan 90 may be separately provided in each of the first transport chamber 33 and the second transport chamber 34, or the first transport chamber 33 and the second transport chamber 34 may be connected by a duct to allow the fan 90 to be shared.

Meanwhile, the first transport chamber 33 communicates with a cleaning unit 31 (31A or 31B) of the first lane L1 via a first communicating hole 39c. Moreover, the first transport chamber 33 communicates with a cleaning unit 31 (31A or 31B) of the second lane L2 via a second communicating hole 39d. A shutter 1c is provided to the first communicating hole 39c, and a shutter 1d is provided to the second communicating hole 39d. The shutters 1c and 1d are closed except for when the transport robot 35 accesses. In addition, each of the cleaning units 31 is connected to an exhaust device (not illustrated), and thus when the shutter 1c or 1d opens or even when the shutters 1c and 1d are closed, through a fine gap, gas is exhausted from the first communicating hole 39c or the second communicating hole 39d.

Here, the exhaust port 37 has a size that substantially equalizes a flow rate of the gas, supplied from the gas supplier 72, exhausted from the first communicating hole 39c and a flow rate of the gas exhausted from the second communicating hole 39d. This is because, as a result of earnest experiments by the inventors of the present invention, it was found that particles accumulated on the bottom surface 33a of the first transport chamber 33 are likely to be raised when the first communicating hole 39c and the second communicating hole 39d are under the same conditions (opening and closing conditions of the shutters 1c and 1d) and a flow rate of the gas exhausted from the second communicating hole 39d is smaller than the flow rate of the gas exhausted from the first communicating hole 39c. Therefore, in the present embodiment, while each of the flow rate of the gas exhausted from the first communicating hole 39c and the flow rate of the gas exhausted from the second communicating hole 39d is detected using a flowmeter, the size of the gap is adjusted by using the gap adjuster 85 such that the respective flow rates are substantially equal.

The transport chamber interior cleaner 73 cleans the inside of the first transport chamber 33. The transport chamber interior cleaner 73 has nozzles 100 capable of jetting out liquid toward the side wall surfaces 33b of the first transport chamber 33. The plurality of nozzles 100 is provided along the respective side wall surfaces 33b in the vicinity of the top surface 33c of the first transport chamber 33. From the nozzles 100, a liquid such as pure water is sprayed. The timing of spraying from the nozzles 100 may be at any time as long as the transport robot 35 is stopped. Moreover, it is preferable that the nozzles 100 be provided at positions that do not obstruct the downflow from the gas supplier 72.

According to the cleaner 30 having the above configuration, as illustrated in FIG. 4A, since the exhaust port 37 is provided in the lower portion of the first transport chamber 33, the gas 200 compressed when the transport robot 35 descends can be exhausted from the lower portion of the first transport chamber 33. This suppresses the pressure in the lower portion of the first transport chamber 33 from becoming higher than the pressure in the upper portion of the first transport chamber 33, thereby suppressing the occurrence of an upward current through a gap between the side wall surfaces 33b of the first transport chamber 33 and the transport robot 35, which can prevent the particles accumulated on the bottom surface 33a of the first transport chamber 33 from being raised. Therefore, adhesion of particles to a cleaned substrate W is reduced, which can improve the yield of products.

Meanwhile, the liquid 201 dropped from a cleaned substrate W or the like is present on the bottom surface 33a of the first transport chamber 33, and thus it is anticipated that the liquid 201 may be discharged together from the exhaust port 37 when the compressed gas 200 is exhausted from the lower portion of the first transport chamber 33. Therefore, the cleaner 30 has the liquid remaining unit 71 which causes the liquid 201 transported to the compressed gas 200 to remain in the lower portion of the first transport chamber 33. The liquid remaining unit 71 includes the jetty 80 of a projecting shape provided upright between the bottom surface 33a of the first transport chamber 33 and the exhaust port 37 and the roof 81 of a recessed shape facing the jetty 80 with a gap therebetween. According to this configuration, the liquid 201 transported to the compressed gas 200 can be blocked before reaching the exhaust port 37, and only the gas 200 taking a detour around the jetty 80 can be exhausted from the exhaust port 37.

Moreover, by adopting the labyrinth structure of communicating to the exhaust port 37 after a detour around the jetty 80, it becomes difficult for particles to enter the first transport chamber 33 via the exhaust port 37 from the outside of the first transport chamber 33. Furthermore, by constantly supplying gas from the upper portion of the first transport chamber 33 to the lower portion by the gas supplier 72, entry of external particles via the exhaust port 37 can be suppressed more reliably. In addition, by cleaning the side wall surfaces 33b of the first transport chamber 33 periodically by the transport chamber interior cleaner 73, the degree of cleanliness inside the first transport chamber 33 can be enhanced.

In this example, since the roof 81 of the recessed shape of the liquid remaining unit 71 has the inclined frame 82 inclined downward from the exhaust port 37 toward the bottom surface 33a of the first transport chamber 33, the liquid 201 does not stay on the roof 81. Therefore, even when liquid is jetted out from the nozzles 100 toward the side wall surfaces 33b of the first transport chamber 33 by the transport chamber interior cleaner 73 as illustrated in FIG. 4B, the liquid 201 can be guided to the bottom surface 33a of the first transport chamber 33 including the drain port 38. Therefore, particles accumulated on the bottom surface 33a of the first transport chamber 33 can be washed away from the drain port 38 together with the liquid 201, which can suppress accumulation of particles which cause the particles to be raised.

As described above, according to the present embodiment described above, it is possible to suppress particles from being raised as the transport robot 35 descends while discharge of the liquid 201 is also suppressed by employing the configuration including: the plurality of processing units including the cleaning units 31 which clean the substrate W, the first transport chamber 33 provided between the plurality of processing units, the transport robot 35 provided inside the first transport chamber 33 so as to be movable vertically, the exhaust port 37 which discharges the gas 200 compressed when the transport robot 35 descends from the lower portion of the first transport chamber 33, and the liquid remaining unit 71 which causes the liquid 201 transported to the compressed gas 200 to remain in the lower portion of the first transport chamber 33.

Although the preferred embodiments of the present invention have been described and explained, it is to be understood that these are merely examples of the invention and are not to be considered as limiting the invention. Additions, omissions, substitutions, and other modifications can be made without departing from the scope of the present invention. Accordingly, the present invention is not to be regarded as being limited by the foregoing description but is limited by the claims.

For example, as one aspect of the present invention, a modification as the following may be adopted. Note that, in the following description, the same reference numeral is given to the same or equivalent component as in the embodiment described above, and description thereof is simplified or omitted. Note that, in modifications illustrated in FIGS. 5A to 8B, examples in which exhaust ports 37 are provided at two positions on the left and right of the bottom surface 33a of the first transport chamber 33 are illustrated.

Figure 5A:
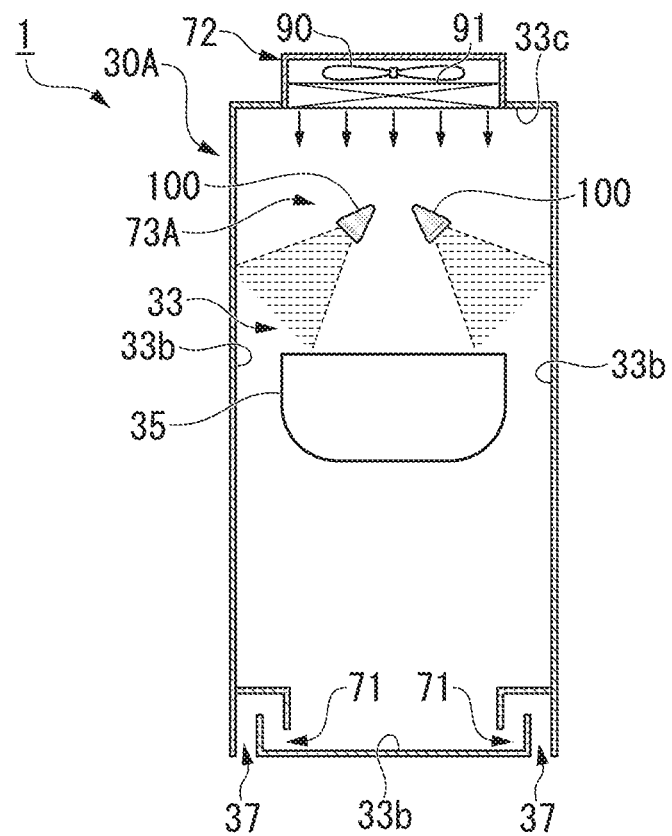
FIG. 5A is a schematic vertical cross-sectional view representing a cleaner 30A according to a modification of the embodiment.
Figure 5B:
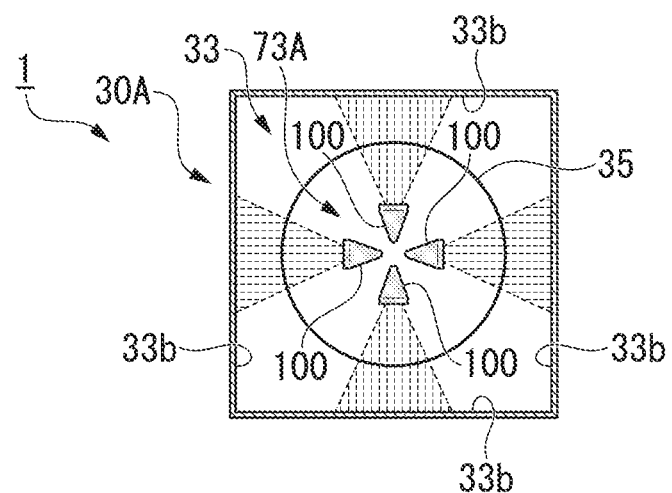
FIG. 5B is a schematic horizontal cross-sectional view representing the cleaner 30A according to the modification of the embodiment.

FIG. 5A is a schematic vertical cross-sectional view representing a cleaner 30A according to a modification of the embodiment, and FIG. 5B is a schematic horizontal cross-sectional view representing the cleaner 30A.

In a transport chamber interior cleaner 73A of the cleaner 30A illustrated in FIG. 5A, a plurality of nozzles 100 is arranged in the center of the upper portion of a first transport chamber 33. As illustrated in FIG. 5B, the plurality of nozzles 100 is arranged such that each of the nozzles 100 faces one of the four side wall surfaces 33b. According to this configuration, since a distance from the nozzles 100 to the side wall surfaces 33b increases, a spray range (liquid jetted range) per nozzle 100 expands, which can reduce the number of nozzles 100 installed.

Figure 6A:
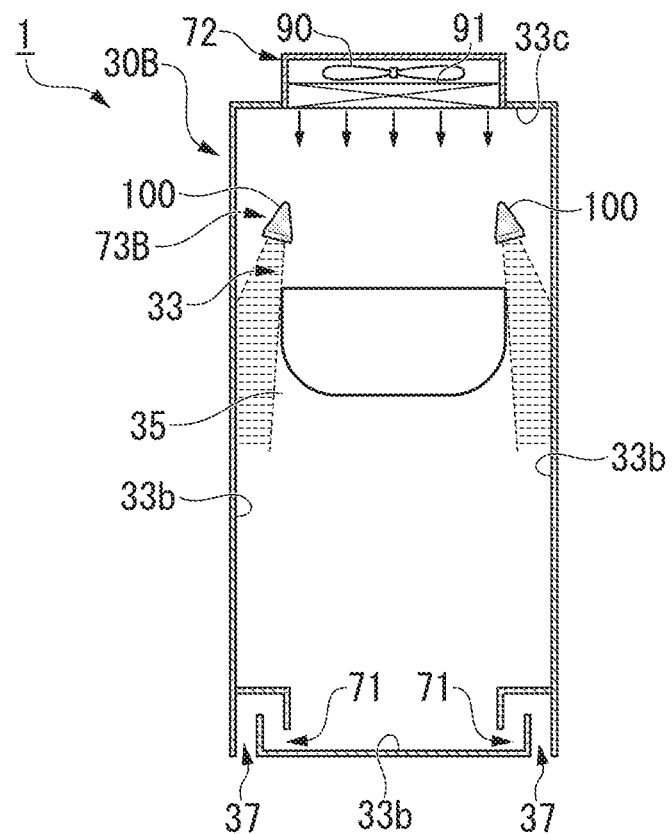
FIG. 6A is a schematic vertical cross-sectional view representing a cleaner 30B according to a modification of the embodiment.
Figure 6B:
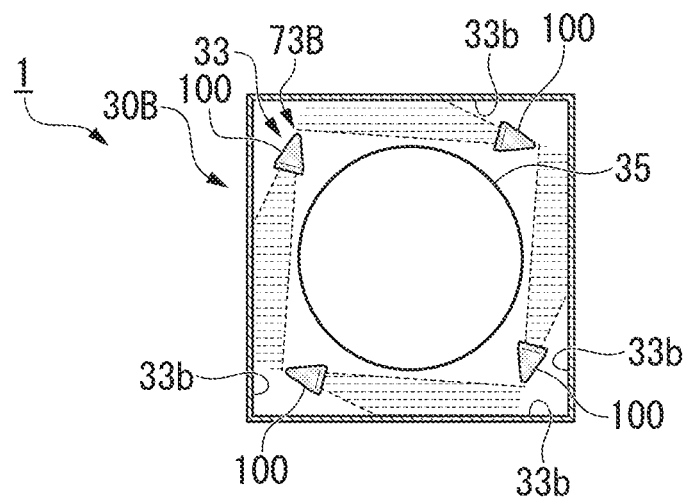
FIG. 6B is a schematic horizontal cross-sectional view representing the cleaner 30B according to the modification of the embodiment.

FIG. 6A is a schematic vertical cross-sectional view representing a cleaner 30B according to a modification of the embodiment, and FIG. 6B is a schematic horizontal cross-sectional view representing the cleaner 30B.

In a transport chamber interior cleaner 73B of the cleaner 30B illustrated in FIG. 6A, a plurality of nozzles 100 is arranged along side wall surfaces 33b of a first transport chamber 33 so as not to obstruct the movement of a transport robot 35 or a downflow from a gas supplier 72. As illustrated in FIG. 6B, the plurality of nozzles 100 jets out liquid obliquely in plan view toward four side wall surfaces 33b, thereby ensuring a wide spray range (liquid jetted range) per nozzle 100.

Figure 7A:
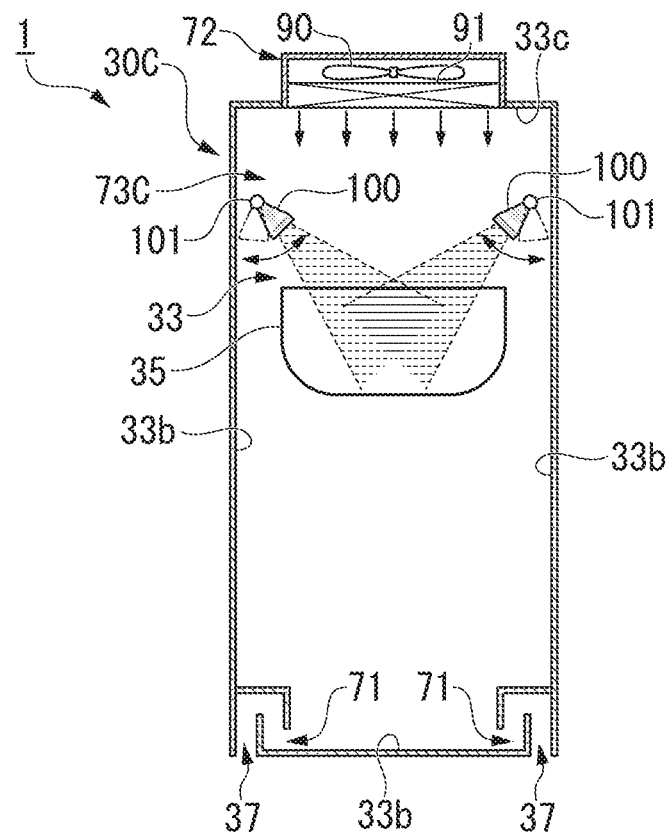
FIG. 7A is a schematic vertical cross-sectional view representing a cleaner 30C according a modification of the embodiment.
Figure 7B:
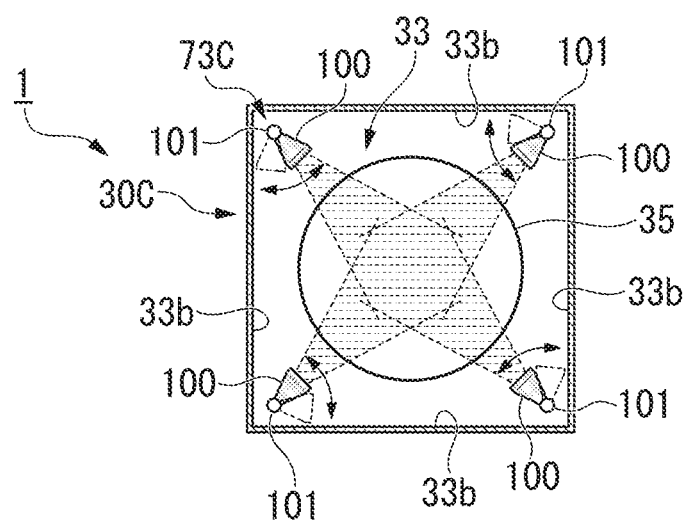
FIG. 7B is a schematic horizontal cross-sectional view representing the cleaner 30C according to the modification of the embodiment.

FIG. 7A is a schematic vertical cross-sectional view representing a cleaner 30C according to a modification of the embodiment, and FIG. 7B is a schematic horizontal cross-sectional view representing the cleaner 30C.

A transport chamber interior cleaner 73C of the cleaner 30C illustrated in FIG. 7A has nozzle-moving devices 101. A nozzle-moving device 101 has a driver that causes a nozzle 100 to swing about a predetermined axis and moves the nozzle 100 between a transport chamber interior cleaning position (indicated by a two-dot chain line in FIGS. 7A and 7B (same position as in FIGS. 6A and 6B)) where the nozzle 100 is directed toward a side wall surface 33b of the first transport chamber 33 and a transport robot cleaning position (indicated by a solid line in FIGS. 7A and 7B) where the nozzle 100 is directed toward the transport robot 35. According to this configuration, not only the side wall surfaces 33b of the first transport chamber 33 but also the transport robot 35 can be cleaned, and thus the degree of cleanness of the first transport chamber 33 can be further enhanced.

Figure 8A:
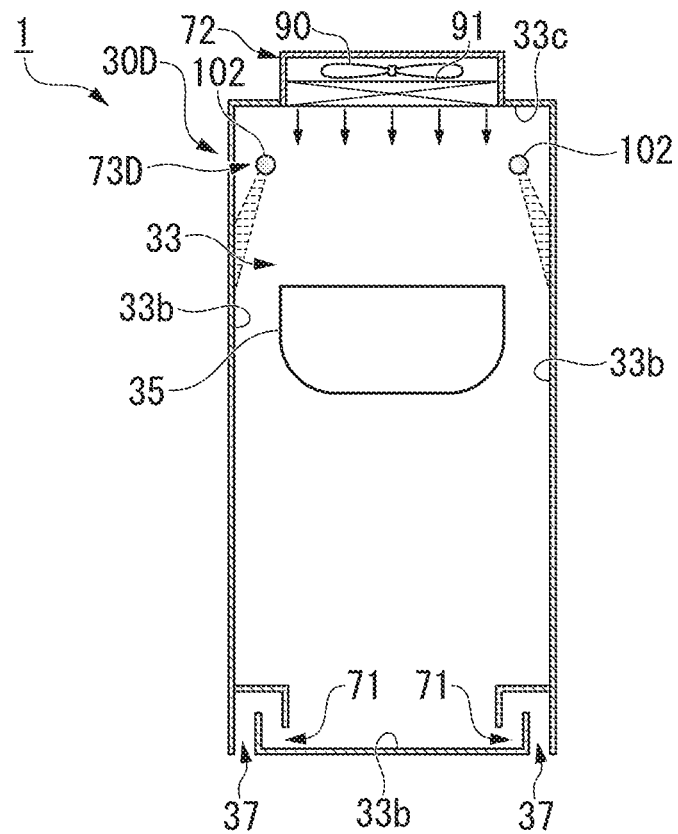
FIG. 8A is a schematic vertical cross-sectional view representing a cleaner 30D according a modification of the embodiment.
Figure 8B:
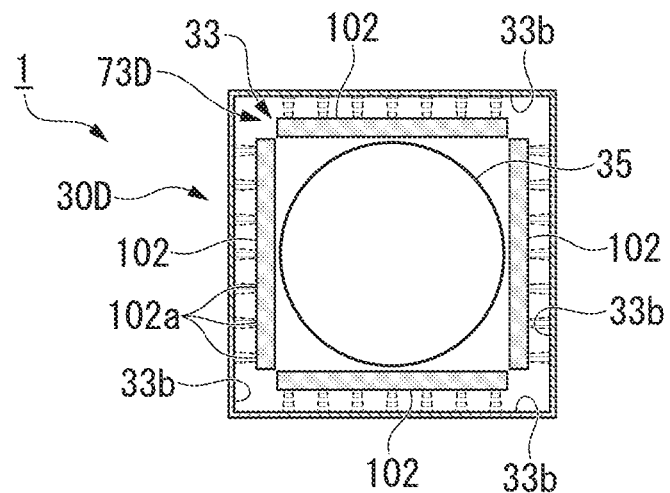
FIG. 8B is a schematic horizontal cross-sectional view representing the cleaner 30D according to the modification of the embodiment.

FIG. 8A is a schematic vertical cross-sectional view representing a cleaner 30D according to a modification of the embodiment, and FIG. 8B is a schematic horizontal cross-sectional view representing the cleaner 30D.

A transport chamber interior cleaner 73D of the cleaner 30D illustrated in FIG. 8A has a sprinkling pipe 102 arranged along side wall surfaces 33b of a first transport chamber 33. As illustrated in FIG. 8B, a plurality of jetting ports 102a is formed at intervals in the sprinkling pipe 102 in the longitudinal direction thereof. According to this configuration, it is possible to jet out liquid from a single sprinkling pipe 102 over a wide range. Note that, in this modification, although each of a plurality of sprinkling pipes 102 is arranged for one of the four side wall surfaces 33b from the perspective of pressure loss, the sprinkling pipes may be connected in a substantially annular shape.

Moreover, for example in the embodiment described above, the configuration in which the cleaning apparatus of the present invention is applied to the cleaner 30 of the substrate processing apparatus 1 has been described as an example; however, for example, the present invention may be a single cleaning apparatus used for cleaning a substrate or may also be applied to a cleaner of an apparatus other than a CMP apparatus (for example, a back surface polishing apparatus, a bevel polishing apparatus, an etching apparatus, or a plating apparatus).

Furthermore, for example in the above embodiment, the chemical mechanical polishing (CMP) apparatus which polishes a surface of a substrate W such as a silicon wafer into a flat surface while supplying a polishing liquid has been described as an example; however, the cleaning apparatus of the present invention can be also applied as an apparatus which cleans a substrate W having been subjected to grinding and polishing processing in a grinding apparatus which grinds a back surface of the substrate W by pressing a grinding wheel, which is formed by abrasive grains made of diamond fixed by an adhesive agent such as a resin bond, against the back surface of the substrate W while rotating the grinding wheel at a high speed.

DESCRIPTION OF THE REFERENCE SYMBOLS

1 Substrate processing apparatus
30 Cleaner (cleaning apparatus)
31 Cleaning unit (processing unit)
32 Drying unit (processing unit)
33 First transport chamber (transport chamber)
33a Bottom surface
33b Side wall surface
34 Second transport chamber (transport chamber)
35 Transport robot
36 Transport robot
37 Exhaust port (exhaust port portion)
38 Drain port
39c First communicating hole
39d Second communicating hole
71 Liquid remaining unit
72 Gas supplier
73 Transport chamber interior cleaner
80 Jetty
81 Roof 85 Gap adjuster
100 Nozzle
101 Nozzle-moving device
200 Gas
201 Liquid
W Substrate (processing object)

What is claimed is:

1. A cleaning apparatus, comprising:
a plurality of processing units comprising a cleaning unit which cleans a processing object;
a transport chamber provided between the plurality of processing units;
a transport robot provided inside the transport chamber so as to be movable vertically;
an exhaust port portion which discharges gas compressed, when the transport robot descends, from a lower portion of the transport chamber; and
a liquid remaining unit which causes liquid transported to the compressed gas to remain in the lower portion of the transport chamber,
wherein the exhaust port portion opens on a bottom surface of the transport chamber,
wherein the liquid remaining unit comprises a jetty of a projecting shape provided upright between the bottom surface of the transport chamber and the exhaust port portion and a roof of a recessed shape facing the jetty with a gap therebetween, and
wherein the roof is inclined downward from the exhaust port portion toward the bottom surface of the transport chamber.

2. The cleaning apparatus according to claim 1, wherein the roof has a gap adjuster which adjusts a size of the gap from the jetty.

3. The cleaning apparatus according to claim 1, further comprising a gas supplier which supplies gas from an upper portion to the lower portion of the transport chamber.

4. The cleaning apparatus according to claim 3,
wherein the plurality of processing units comprises:
a first processing unit communicating with the transport chamber via a first communicating hole; and
a second processing unit communicating with the transport chamber via a second communicating hole below the first processing unit, and
the exhaust port has a size that substantially equalizes a flow rate of the gas, supplied from the gas supplier, exhausted from the first communicating hole and a flow rate of the gas exhausted from the second communicating hole.

5. The cleaning apparatus according to claim 1, further comprising a transport chamber interior cleaner which cleans an inside of the transport chamber.

6. The cleaning apparatus according to claim 5, wherein the transport chamber interior cleaner has a nozzle capable of jetting out liquid toward a side wall surface of the transport chamber.

7. The cleaning apparatus according to claim 5, wherein the transport chamber interior cleaner further comprises a nozzle-moving device which moves the nozzle between a transport chamber interior cleaning position where the nozzle is directed toward a side wall surface of the transport chamber and a transport robot cleaning position where the nozzle is directed toward the transport robot.

8. A substrate processing apparatus, comprising:
a polisher which polishes a substrate; and
a cleaner which cleans the substrate,
wherein the substrate processing apparatus comprises the cleaning apparatus according to claim 1 as the cleaner.

9. A cleaning apparatus, comprising:
a plurality of processing units comprising a cleaning unit which cleans a processing object;
a transport chamber provided between the plurality of processing units;
a transport robot provided inside the transport chamber so as to be movable vertically;
an exhaust port portion which discharges gas compressed, when the transport robot descends, from a lower portion of the transport chamber; and
a liquid remaining unit which causes liquid transported to the compressed gas to remain in the lower portion of the transport chamber,
wherein the exhaust port portion opens on a bottom surface of the transport chamber,
wherein the liquid remaining unit comprises a jetty of a projecting shape provided upright between the bottom surface of the transport chamber and the exhaust port portion and a roof of a recessed shape facing the jetty with a gap therebetween, and
wherein the roof has a gap adjuster which adjusts a size of the gap from the jetty.

10. A cleaning apparatus, comprising:
a plurality of processing units comprising a cleaning unit which cleans a processing object;
a transport chamber provided between the plurality of processing units;
a transport robot provided inside the transport chamber so as to be movable vertically;
an exhaust port portion which discharges gas compressed, when the transport robot descends, from a lower portion of the transport chamber;
a liquid remaining unit which causes liquid transported to the compressed gas to remain in the lower portion of the transport chamber; and
a transport chamber interior cleaner which cleans an inside of the transport chamber,
wherein the transport chamber interior cleaner has a nozzle comprising a jetting-out port portion which opens toward a side wall surface of the transport chamber and which is capable of jetting out liquid toward the side wall surface of the transport chamber.

11. The cleaning apparatus according to claim 10, wherein the transport chamber interior cleaner further comprises a nozzle-moving device which moves the nozzle between a transport chamber interior cleaning position where the nozzle is directed toward a side wall surface of the transport chamber and a transport robot cleaning position where the nozzle is directed toward the transport robot.

12. The cleaning apparatus according to claim 11, wherein the nozzle-moving device rotates around an axis of the nozzle to move the nozzle between the transport chamber interior cleaning position and a transport robot cleaning position.

\* \* \* \* \*